United States Patent
Chadha et al.

(10) Patent No.: US 12,162,111 B2
(45) Date of Patent: *Dec. 10, 2024

(54) ELECTROSTATIC CHUCK WITH POROUS PLUG

(71) Applicant: Applied Materials, Inc., Santa Clara, CA (US)

(72) Inventors: Arvinder Chadha, San Jose, CA (US); Tomoaki Kohzu, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/383,430

(22) Filed: Oct. 24, 2023

(65) Prior Publication Data
US 2024/0051075 A1    Feb. 15, 2024

Related U.S. Application Data

(63) Continuation of application No. 17/592,400, filed on Feb. 3, 2022, now Pat. No. 11,794,296.

(51) Int. Cl.
| | |
|---|---|
| *H01T 23/00* | (2006.01) |
| *B23B 31/28* | (2006.01) |
| *B23Q 3/15* | (2006.01) |
| *H01L 21/683* | (2006.01) |

(52) U.S. Cl.
CPC .............. *B23Q 3/15* (2013.01); *B23B 31/28* (2013.01); *H01L 21/6833* (2013.01)

(58) Field of Classification Search
None
See application file for complete search history.

(56) References Cited

U.S. PATENT DOCUMENTS

| | | |
|---|---|---|
| 5,696,189 A | 12/1997 | Legare |
| 10,249,526 B2 | 4/2019 | Parkhe |
| 10,688,750 B2 | 6/2020 | Parkhe et al. |
| 10,847,402 B2 | 11/2020 | Boyd, Jr. et al. |
| 11,794,296 B2* | 10/2023 | Chadha ............ H01L 21/68757 |
| 2004/0040664 A1 | 3/2004 | Yang et al. |
| 2009/0301712 A1 | 12/2009 | Campbell |
| 2009/0302001 A1 | 12/2009 | Mayers et al. |
| 2011/0005681 A1 | 1/2011 | Savas et al. |
| 2012/0100379 A1 | 4/2012 | Luo et al. |
| 2014/0020834 A1 | 1/2014 | Zhou et al. |
| 2014/0107280 A1 | 4/2014 | Luo et al. |

(Continued)

FOREIGN PATENT DOCUMENTS

| | | |
|---|---|---|
| EP | 1316110 B1 | 12/2008 |
| WO | 2020167451 A1 | 8/2020 |

OTHER PUBLICATIONS

U.S. Appl. No. 17/571,002, filed Jan. 7, 2022 Entitled "Porous Plug Bonding".

(Continued)

*Primary Examiner* — Stephen W Jackson
(74) *Attorney, Agent, or Firm* — Patterson + Sheridan, LLP (57) ABSTRACT

Electrostatic chucks and method for forming the same are described herein. The electrostatic chucks include a backside gas passage having a ceramic porous plug secured therein by a ceramic body of the chuck with a ceramic-to-ceramic body. In one example, ceramic porous plug is sintered with the ceramic body.

23 Claims, 4 Drawing Sheets

(56) References Cited

U.S. PATENT DOCUMENTS

| | | |
|---|---|---|
| 2017/0256431 A1 | 9/2017 | Parkhe |
| 2019/0242480 A1 | 8/2019 | Nakagawa et al. |
| 2019/0371578 A1 | 12/2019 | Larosa et al. |
| 2020/0035535 A1 | 1/2020 | Parkhe |
| 2020/0105568 A1 | 4/2020 | Pilgrim |
| 2020/0373184 A1 | 11/2020 | Prouty et al. |
| 2020/0411283 A1 | 12/2020 | Bonecutter et al. |
| 2020/0411355 A1 | 12/2020 | Noorbakhsh et al. |

OTHER PUBLICATIONS

International Search Report and Written Opinion for Application No. PCT/US2023/010342 dated May 4, 2023.

* cited by examiner

ELECTROSTATIC CHUCK WITH POROUS PLUG

CROSS-REFERENCE TO RELATED APPLICATIONS

This application is a continuation of U.S. Non-Provisional patent application Ser. No. 17/592,400, filed Feb. 3, 2022, now U.S. Pat. No. 11,794,269, issues Oct. 24, 2023, which is incorporated herein by reference in its entirety.

BACKGROUND

Field

Implementations described herein generally relate to a substrate support assembly and more particularly to a substrate support assembly having a bonded porous plug and methods of bonding the porous plug with the substrate support assembly.

Description of the Related Art

Substrate support assemblies are widely used to support substrates within semiconductor processing systems during processing. One particular type of substrate support assembly includes a ceramic electrostatic chuck mounted on a cooling base. Electrostatic chucks generally retain the substrate in a stationary position during processing. Electrostatic chucks contain one or more embedded electrodes within a ceramic body. As an electrical potential is applied between the electrodes and a substrate disposed on the ceramic body, an electrostatic attraction is generated, which holds the substrate against a support surface of the ceramic body. The force generated may have a capacitive effect due to a potential difference between the substrate and the electrodes or, in the case of ceramic bodies comprised of semiconducting materials having a relatively low resistivity, which allow charge migration within the ceramic body to the surface approximate the substrate, a Johnsen-Rahbeck effect. Electrostatic chucks utilizing capacitive and Johnsen-Rahbeck attractive forces are commercially available from a number of sources.

To control the substrate temperature during processing, a backside gas is provided through a gas passage formed in the ceramic body to the support surface of the ceramic body below the substrate. The backside gas fills the interstitial area between the ceramic body and the substrate, thus providing a heat transfer medium that enhances the rate of heat transfer between the substrate and the substrate support. A porous ceramic plug is positioned in the gas passage to prevent ignition of the backside gas flowing through the gas passage within the ceramic body. The porous plug is secured to the ceramic body using an adhesive.

However, insertion of the plug into the ceramic body is unpredictable. The variation in the quality of plug insertion allows erosion of the adhesive retaining the plug to the ceramic body over the service life of the electrostatic chuck, and facilitates premature arcing failures and secondary particle contamination of the substrate. Variation is exasperated by manual application of the adhesive used to secure the plug. Further, the bond adhesion may further weaken due to plasma, CTE mismatch and friction between the ceramic body, porous plug and/or substrate when exposed to elevated temperatures. Once the adhesive is compromised, contamination of the substrate is inevitable as material eroded from the adhesive layer becomes a process contaminant that produces defects and reduces product yields. Additionally, the compromised porous plug to ceramic body bond further allows attack of the bond layer securing the electrostatic chuck to the cooling base by process and other gases, dramatically reducing the service life of the electrostatic chuck.

Therefore, there is a need for an improved electrostatic chuck and methods of manufacturing the same.

SUMMARY

Electrostatic chucks and method for forming the same are described herein. The electrostatic chucks include a ceramic body having a backside gas passage in which a ceramic porous plug is secured using a ceramic-to-ceramic bond. In one example, ceramic porous plug is sintered with the ceramic body. Although sintering a ceramic porous plug together with a ceramic body is described as forming an electrostatic chuck as a primary example, the method described herein can also be practiced to join a ceramic porous plug and a ceramic structure other than an electrostatic chuck to form a single fired ceramic body with an integrally sintered porous plug disposed within a passage of the ceramic structure.

In another example, an electrostatic chuck includes a ceramic body and a ceramic porous plug disposed in a gas passage of the ceramic body. The ceramic body includes a substrate support surface and a bottom surface. The ceramic body includes an electrode and a gas passage extending between the substrate support surface and the bottom surface. The ceramic porous plug is secured in the gas passage by a ceramic-to-ceramic bond.

In another example, an electrostatic chuck is provided that is suitable for use in a semiconductor processing chamber. The electrostatic chuck includes a ceramic body and a ceramic porous plug. The ceramic body has a substrate support surface and a bottom surface, an electrode and a gas passage extending between the substrate support surface and the bottom surface. The ceramic porous plug is disposed in the gas passage and is sintered to the ceramic body. A temperature control base is secured to the bottom surface of the ceramic body by an adhesive layer. The temperature control base includes a gas delivery hole that is aligned with the gas passage formed in the ceramic body. The aligned gas delivery hole and gas passage are configured to flow backside gas to a support surface of the ceramic body.

In still another example, a method for fabricating an electrostatic chuck is provided. The method includes disposing a ceramic porous plug at least partially in a hole formed in a ceramic structure, the hole configured to become a fluid passage; and sintering the ceramic structure and ceramic porous plug to form a ceramic-to-ceramic bond therebetween.

In one example, the ceramic structure is a ceramic body of an electrostatic chuck. In other examples, the ceramic structure may be a plate, a shield, a liner, a body, a filter, a container or gas distribution plate, among others structures.

BRIEF DESCRIPTION OF THE DRAWINGS

So that the manner in which the above recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

Many of the details, scale, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

DETAILED DESCRIPTION

The following disclosure describes electrostatic chucks having a ceramic body in which a ceramic porous plug is secured by a ceramic-to-ceramic bond. Methods for forming the same are also described. The ceramic-to-ceramic bond between the ceramic body and the ceramic porous plug eliminates the use of bonding materials to secure the ceramic porous plug in a backside gas passage of the ceramic body. Consequently, contamination of substrate processed on the electrostatic chuck and chuck failure modes are reduced, while chuck service life is extended. Thus, ceramic-to-ceramic bonding of the ceramic porous plug to the ceramic body results in a robust and reliable electrostatic chuck with vastly improved chuck-to-chuck performance uniformity. These benefits provide a significant reduction in the cost of ownership, while synergistically improving production yields and production capacity due to reduced particle contamination and longer mean times between service intervals associated with the use of the electrostatic chuck.

Figure 1:
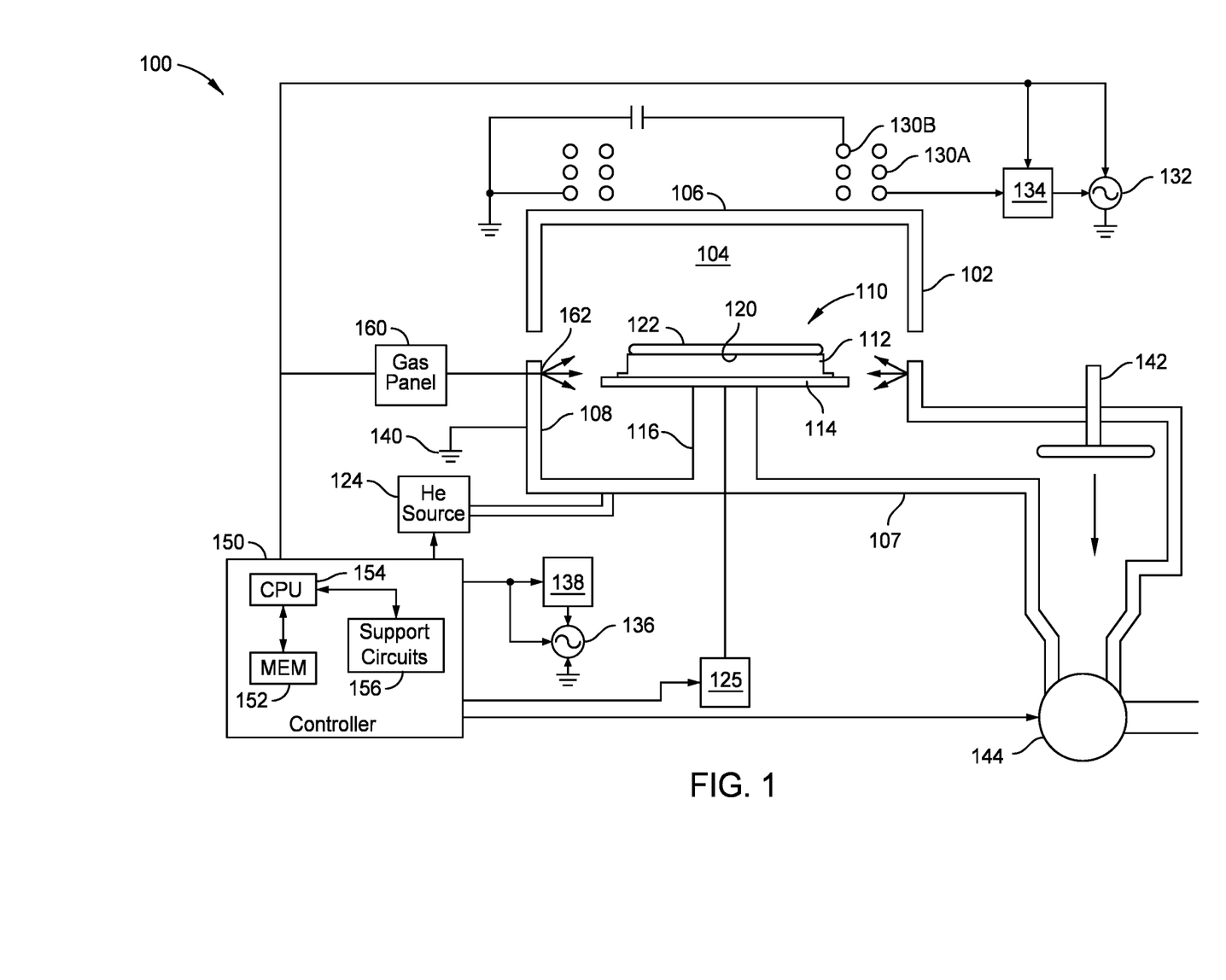
FIG. 1 is a schematic view of a processing chamber including a substrate support assembly having a co-sintered porous plug according to one or more implementations of the present disclosure.

Turning now to FIG. 1, a schematic diagram of a processing chamber 100 including a substrate support assembly 110 is illustrated according to one or more implementations of the present disclosure. The substrate support assembly 110 includes an electrostatic chuck 112 disposed on a temperature control base 114. The electrostatic chuck 112 has a ceramic porous plug secured in a backside gas passage using a ceramic-to-ceramic bond as later described below that provides the advantages described above. As additionally noted herein, the ceramic porous plug may alternatively be secured in a fluid passage of other types of ceramic structures using a ceramic-to-ceramic bond.

The processing chamber 100 includes a chamber body 102, which defines a processing volume 104. The substrate support assembly 110 is positioned within the processing volume 104. The chamber body 102 includes a ceiling 106, a bottom wall 107, and one or more chamber walls 108. The ceiling 106 can be composed of a dielectric material.

The substrate support assembly 110 is generally supported above the bottom wall 107 of the processing chamber 100 by a shaft 116 coupled to the temperature control base 114. The substrate support assembly 110 is fastened to the shaft 116 such that the substrate support assembly 110 can be removed from the shaft 116, refurbished, and re-fastened to the shaft 116. The shaft 116 is sealed to the temperature control base 114 to isolate various conduits and electrical leads disposed therein from the process environment within the processing chamber 100. Alternatively, the electrostatic chuck 112 and the temperature control base 114 maybe disposed on an insulating plate that is attached to a ground plate or chassis. Further, the ground plate may be attached to one or more of the ceiling 106, the bottom wall 107, and the one or more chamber walls 108.

The electrostatic chuck 112 is generally circular in form but can alternatively comprise other geometries to accommodate non-circular substrates. For example, the electrostatic chuck 112 may comprise a square or rectangular substrate when used in processing display glass, such as such as glass for flat panels displays. The electrostatic chuck 112 includes a substrate support surface 120 for supporting a substrate, for example, a substrate 122, for example, a semiconductor substrate. The temperature of the substrate 122 is controlled by controlling the temperature of the electrostatic chuck 112. The temperature control base 114 includes heating and/or cooling elements that are utilized to heat and/or cool the electrostatic chuck 112 that is secured to the top surface of the temperature control base 114. In one example, the temperature control base 114 may include resistive heaters and/or conduits for flowing a heat transfer fluid such that heat may be transfer to, or pulled away from, the electrostatic chuck 112 thus controlling the temperature of the electrostatic chuck 112 along with the substrate 122 positioned thereon. To promote heat transfer between the electrostatic chuck 112 and the substrate 122, a backside gas (e.g., helium, nitrogen, argon or other gas) may be provided by a gas source 124 to the interstitial space defined between the substrate 122 and the substrate support surface 120 of the electrostatic chuck 112. The backside gas provides a heat transfer medium that facilitates heat transfer between the substrate 122 and the substrate support assembly 110, thus enhancing control the temperature of the substrate 122 during processing, cleaning or when otherwise desired.

The electrostatic chuck 112 may also include one or more heaters. For example, the heaters may be resistive heaters or the like. The electrostatic chuck 112 include one or more electrodes, which may be coupled to a power supply 125. At least one of the electrodes of the electrostatic chuck 112 is utilized to generate the electrostatic force that secures the substrate 122 to the substrate support surface 120 of the electrostatic chuck 112. Optional other electrodes disposed within the electrostatic chuck 112 may be utilized for plasma control, cleaning, or other purpose.

The processing chamber 100 further includes at least an inductive coil antenna segment 130A and a conductive coil antenna segment 130B, both positioned exterior to the ceiling 106. The inductive coil antenna segment 130A and the conductive coil antenna segment 130B are each coupled to a radio-frequency (RF) source 132 that produces an RF signal. The RF source 132 is coupled to the inductive coil antenna segment 130A and to the conductive coil antenna segment 130B through a matching network 134. The substrate support assembly 110 is also coupled to an RF source 136 that produces an RF signal. The RF source 136 is coupled to the substrate support assembly 110 through a matching network 138. The one or more chamber walls 108 can be conductive and connected to an electrical ground 140.

The pressure within the processing volume 104 of the processing chamber 100 is controlled using a throttle valve 142 situated between the processing chamber 100 and a vacuum pump 144. The temperature at the surface of the one or more chamber walls 108 is controlled using liquid-containing conduits (not shown) that are located in the one or more chamber walls 108 of the processing chamber 100.

A system controller 150 is coupled to the various components of the processing chamber 100 to facilitate control of the substrate processing process. The system controller 150 includes memory 152, a central processing unit (CPU) 154, and support circuits (or I/O) 156. Software instructions and data can be coded and stored within the memory for instructing the CPU. The system controller 150 can communicate with one or more of the components of the processing chamber 100 via, for example, a system bus. A program (or computer instructions) readable by the system controller 150 determines which tasks are performable on a substrate. In some aspects, the program is software readable by the system controller 150. Although a single system controller 150 is shown, it should be appreciated that multiple system controllers can be used with the aspects described herein.

In one example of operation, the substrate 122 is placed on the substrate support surface 120 of the substrate support assembly 110. Backside gas is provided between the substrate 122 and the substrate support surface 120 of the electrostatic chuck 112 to enhance temperature control of the substrate 122 during processing. Gaseous components are supplied from a gas panel 160 to the processing chamber 100 through entry ports 162 to form a gaseous mixture in the processing volume 104 of the processing chamber 100. The gaseous mixture in the processing volume 104 is ignited into a plasma in the processing chamber 100 by applying RF power from the RF sources 132, 136 respectively to the inductive coil antenna segment 130A, the conductive coil antenna segment 130B and to the substrate support assembly 110. Additionally, chemically reactive ions are released from the plasma and strike the substrate 122; thereby removing exposed material from the substrate's surface.

Although the exemplary processing chamber 100 detailed above is illustrated as an inductively coupled etch processing chamber, the processing chamber 100 may also be configured as another type of etch processing chamber, a chemical vapor deposition chamber, a physical vapor deposition chamber, an ion implantation chamber or other semiconductor, flat panel, or similar processing chamber where the use of a ceramic-to-ceramic bond of a porous plug in a ceramic body is desired.

Figure 2:
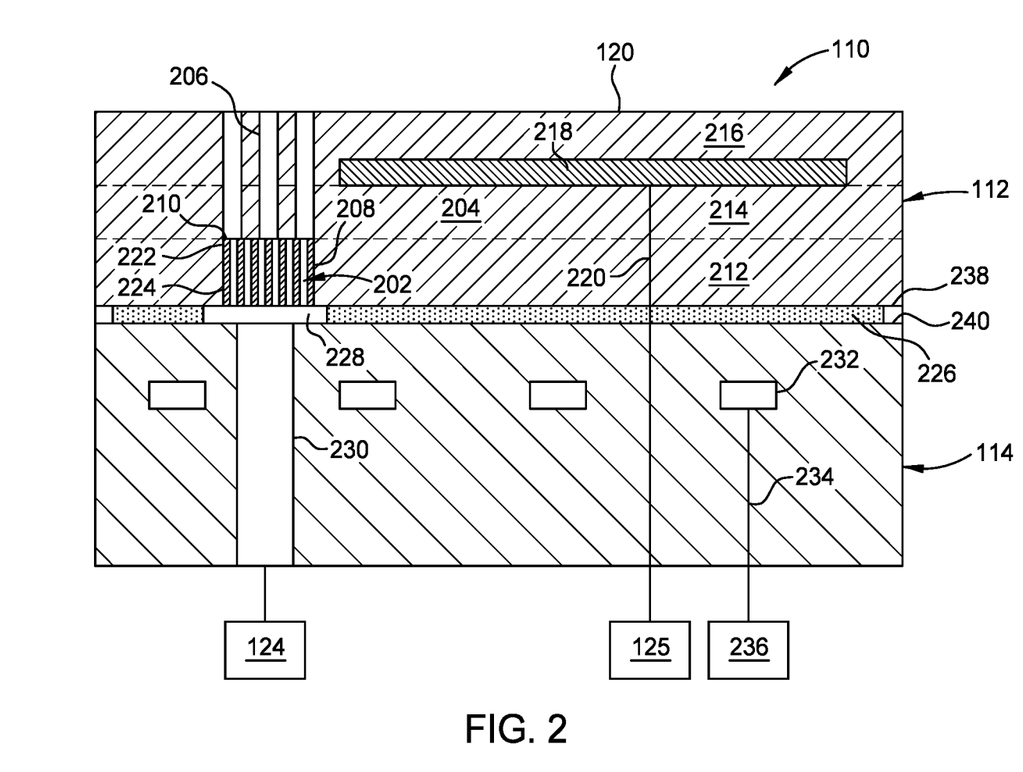
FIG. 2 is a schematic cross-sectional view of the substrate support assembly having a porous plug co-sintered with a ceramic body of an electrostatic chuck according to one or more implementations of the present disclosure.

FIG. 2 is a partial cross-sectional view of the substrate support assembly 110 having a ceramic porous plug 202 secured to a ceramic body 204 of the electrostatic chuck 112 without the use of adhesives. The ceramic body 204 of the electrostatic chuck 112 is fabricated from a ceramic material, such as alumina, aluminum nitride or other suitable ceramic material. For example, the ceramic body 204 of the electrostatic chuck 112 may be fabricated from a low resistivity ceramic material, for example, a material having a resistivity between about $1 \times E^9$ to about $1 \times E^{11}$ ohm-cm. Examples of low resistivity materials include ceramics such as alumina doped with titanium oxide or chromium oxide, doped aluminum oxide, doped boron-nitride and the like. Other materials of comparable resistivity, for example, aluminum nitride, may also be used. Such ceramic materials having relatively low resistivity generally promote a Johnsen-Rahbek attractive force between the substrate and electrostatic chuck 112 when power is applied to a chucking electrode 218 embedded within the ceramic body 204. Alternatively, the ceramic body 204 may comprise ceramic materials having a resistivity equal to or greater than $1 \times E^{11}$ ohms-cm may also be used. Further, the ceramic body 204 of the electrostatic chuck 112 may be fabricated from an aluminum oxide. The aluminum oxide can have high resistivity and be used in Coulombic mode.

The ceramic body 204 is formed from green sheets or layers that are sintered together to form a solid contiguous body of ceramic. In the example depicted in FIG. 2, dashed lines illustrate 3 layers 212, 214, 216 that are stacked together prior to sintering. The number of layers are simply for illustration, as ceramic body 204 may be formed from any number of desired layers. The chucking electrode 218 (and other electrodes and heater, which present) is disposed between the layers, for example layers 214, 216, prior to sintering such that after sintering, the chucking electrode 218 is embedded in the solid mass of ceramic comprising the ceramic body 204.

The chucking electrode 218 is fabricated from an electrically conductive material such as copper, graphite, tungsten, molybdenum and the like. Various implementations of electrode structures include, but are not limited to, a pair of coplanar D-shaped electrodes, coplanar interdigital electrodes, a plurality of coaxial annular electrodes, a singular, circular electrode or other structure. The chucking electrode 218 is coupled to the power supply 125 by a feed-through 220 disposed in the substrate support assembly 110. The power supply 125 may drive the electrode 218 with a positive or negative voltage. For example, the power supply 125 may drive the electrode 218 with a voltage of about −1000 volts or a voltage of about 2500 volts. Alternatively, other negative voltages or other positive voltages may be utilized.

In some examples, each of the layers 212, 214, 216 may be composed of the same type of ceramic material. For example, all of the layers 212, 214, 216 may be formed from ceramic powder having the same powder size, which generally results in uniform grain size across the layers 212, 214, 216 after sintering. In another example, one or more of the layers 212, 214, 216 may be composed of a different type of ceramic material. For example, the top layer 216 may be formed from a ceramic powder having one size powder, while the bottom layer 212 may be formed from a ceramic powder having a different size powder, which generally results in a different grain size in different regions (i.e., formed from the layers 212, 214, 216) after sintering.

The ceramic body 204 also includes a plurality of backside gas passages 206. The backside gas passages 206 are open to the substrate support surface 120 of the electrostatic chuck 112 so that a backside gas may be provided between the substrate and electrostatic chuck to enhance heat transfer as discussed above. The one or more of the backside gas passages 206 forming each backside gas channel through the electrostatic chuck 112 include a hole 208 formed in a bottom surface 238 of the ceramic body 204. The hole 208 is sized to receive at least a portion of the ceramic porous plug 202 such that a backside gas delivery channel is formed through the passages 206, plug 202 and hole 208 to enable backside gas to be provide to the substrate support surface 120 in a region below the substrate to enhance heat transfer between the electrostatic chuck 112 and substrate. The transition between the passages 206 and the hole 208 forms a step 210 upon which the ceramic porous plug 202 may abut to reliably position the plug 202 within the hole 208. Although the hole 208 and cross section of the ceramic plug 202 are typically circular, any complimentary geometry may be utilized. For example, the ceramic plug 202 may have a square profile that fits within a square shaped mating geometry of the hole 208. Moreover, although only one backside gas delivery channel is illustrated in FIG. 2, it is contemplated that a plurality of similarly constructed backside gas delivery channels are distributed across the substrate support surface 120 of the electrostatic chuck 112.

The ceramic porous plug 202 is secured in the hole 208 by a ceramic-to-ceramic bond. That is, the outer diameter surface of the ceramic porous plug 202 is directly bonded using a sintering process to the inside diameter of the hole 208 formed in the ceramic body 204 without the use of adhesives. For example, the ceramic-to-ceramic bond created by the sintering process fuses the ceramic material of the ceramic porous plug 202 together with the ceramic material of the ceramic body 204 to form a singular solid mass by using a combination of pressure and heat without melting the material of the plug 202 and body 204.

The porous plug 202 is fabricated from a ceramic material, such as alumina, aluminum nitride or other suitable ceramic material. The ceramic porous plug 202 may be fabricated from the same types of materials used to fabricate the ceramic body 204. The ceramic porous plug 202 may be entirely formed from ceramic powder having the same powder size, which generally results in uniform grain size across the plug 202. In some examples, the ceramic porous plug 202 may be formed by using different types of ceramic material in different regions of the plug 202. For example, the ceramic porous plug 202 may include an upper region 222 that is adjacent the step 210 of the hole 208 and a lower region 224 that is adjacent the bottom surface 238 of the ceramic body 204. The powder size may be different in each of the regions 222, 224, resulting in a different grain size of the ceramic material in each of the regions 222, 224. The powder size in each of the regions 222, 224 may be the same or different from the powder size utilized in one or more of the layers 212, 214, 216 forming the ceramic body 204. This results in the grain size in one or both regions 222, 224 of the plug 202 being different than grain size in one or more of the layers 212, 214, 216 of the ceramic body 204. In one example, the grain size in one or both regions 222, 224 of the plug 202 is larger than grain size of at least one or more or all of the layers 212, 214, 216 of the ceramic body 204.

The hole 208 formed in the ceramic body 204 aligns with a gas delivery hole 230 formed through the temperature control base 114. The gas delivery hole 230 is coupled to gas source 124 that provides the backside gas, such as helium, nitrogen, argon or other suitable gas.

The adhesive layer 226 joining the electrostatic chuck 112 to the temperature control base 114 includes a gap 228 that allows the backside gas to flow from the gas delivery hole 230 formed in the base 114 to the passages 206 formed in the chuck 112. The adhesive layer 226 may be an acrylic or silicon-based adhesive, epoxy, neoprene based adhesive, an optically clear adhesive such as a clear acrylic adhesive, or other suitable adhesive materials.

The temperature control base 114 is generally fabricated from a metallic material such as stainless steel, aluminum, aluminum alloys, among other suitable materials. Further, the temperature control base 114 includes one or more heat transfer elements 232, such as resistive heaters, thermoelectric devices, or conduits for flowing heat transfer fluid, among others. In the example depicted in FIG. 2, the heat transfer elements 232 are in the form of channels for flowing heat transfer fluid provided from a heat transfer fluid source 236. The heat transfer fluid source 236 is coupled to the channels (e.g., heat transfer elements 232) by a conduit 234.

To further the description of the ceramic porous plug 202, the porous plug 202 can have an open-pore structure meaning that pores in the porous structure are interconnected allowing fluids to flow through the porous plug 202. In some implementations, more than half of the cells in the open-pore structure are interconnected. For example, the porous plug 202 provides a path for pressurized gas to flow to the substrate support surface 120 of the electrostatic chuck 112 from the gas delivery hole 230 formed through the temperature control base 114. The passageways and/or pores that allow gas flow through the ceramic porous plug 202 are sized to reduce the probability that plasma will ignite in the adhesive gap 228 defined between the electrostatic chuck 112 and the temperature control base 114 as compared to a design not including the porous plug 202. In one example, ceramic porous plug 202 may have a porosity of about 30 to about 80 percent. Alternatively, the porous plug may have a porosity of less than 30 percent or greater than 80 percent.

The porous plug 202 can have any suitable shape. In some implementations, the porous plug 202 has a cylindrical shape. Other suitable shapes include T-shaped, taper shaped, and rectangular shaped, among other shapes.

As discussed above, the ceramic-to-ceramic bond between the porous plug 202 and the ceramic body 204 allows the plug 202 to be secured ceramic body 204 without in the adhesives. Advantageously, the plug 202 when co-sintered with the ceramic body 204 forms a singular structure that is highly resistive to erosion from the process gases, has significantly longer service life, and is much less likely to shed particles that could become a process contaminant and lower production yields as compared to conventional electrostatic chucks that utilize adhesive to secure porous plugs.

Figure 3:
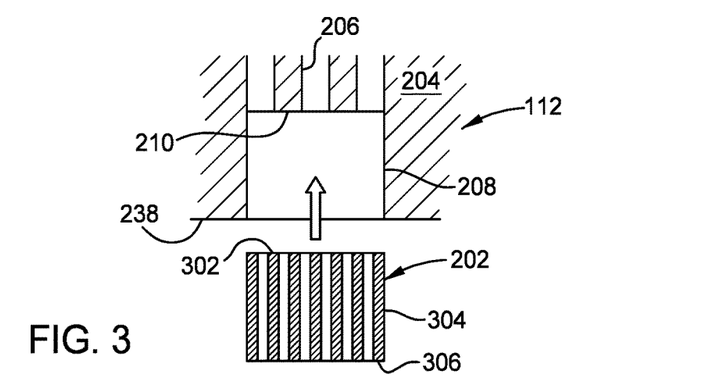
FIG. 3 is a partial cross-sectional exploded view of the electrostatic chuck of FIG. 2 according to one or more implementations of the present disclosure.

FIG. 3 is a partial cross-sectional exploded view of a portion of the electrostatic chuck 112 of FIG. 2, according to one or more implementations of the present disclosure. In the exploded view of FIG. 3, the ceramic porous plug 202 is illustrated prior to insertion into the hole 208 formed in the bottom surface 238 of the ceramic body 204 of the electrostatic chuck 112. In one example, the ceramic porous plug 202 may be fully formed and sintered to form a solid body of ceramic. After insertion, the ceramic porous plug 202 and the ceramic body 204 are sintered together to form a solid body of ceramic.

In another example, the ceramic porous plug 202 may be partially sintered prior to insertion into the hole 208 of the ceramic body 204 of the electrostatic chuck 112. After insertion, the ceramic porous plug 202 and the ceramic body 204 are sintered together to form a solid body of ceramic.

In still another example, the ceramic porous plug 202 may be in a fully green state prior to insertion into the hole 208 of the ceramic body 204 of the electrostatic chuck 112. After insertion, the ceramic porous plug 202 and the ceramic body 204 are sintered together to form a solid body of ceramic.

As shown in FIG. 3, the ceramic porous plug 202 includes a top surface 302, a bottom surface 306 and a sidewall 304. The sidewall 304 may be the outside diameter of the ceramic porous plug 202. In implementations where the sectional profile of the ceramic porous plug 202 is not round, the sidewall 304 or sidewalls 304 simply define the outer circumferential surface of the plug 202, connecting the top and bottom surfaces 302, 306 of the plug 202, that mates against and is sintered together with the sidewalls of the complimentarily shaped hole 208 formed in the ceramic body 204.

Figure 4:
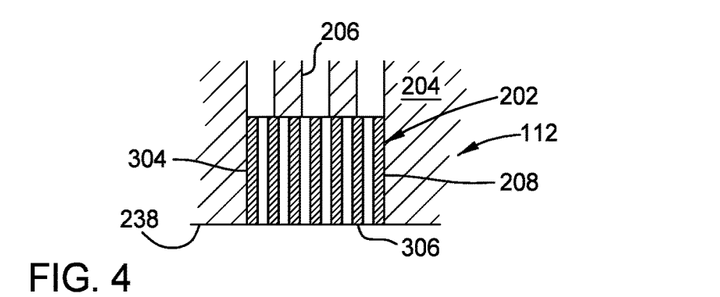
FIG. 4 is a cross-sectional view of a portion of the electrostatic chuck sintered with a porous plug according to one or more implementations of the present disclosure.

FIG. 4 is a cross-sectional view of a portion of the electrostatic chuck 112 sintered with a ceramic porous plug 202 according to one or more implementations of the present disclosure. In the example depicted in FIG. 4, the bottom surface 306 of the ceramic porous plug 202 is substantially flush with the bottom surface 238 of the ceramic body 204. The bottom surface 306 of the ceramic porous plug 202 may be made flush with the bottom surface 238 of the ceramic body 204 by any suitable technique. In one example, the bottom surface 306 of the ceramic porous plug 202 is ground co-planar with the bottom surface 238 of the ceramic body 204.

Figure 5:
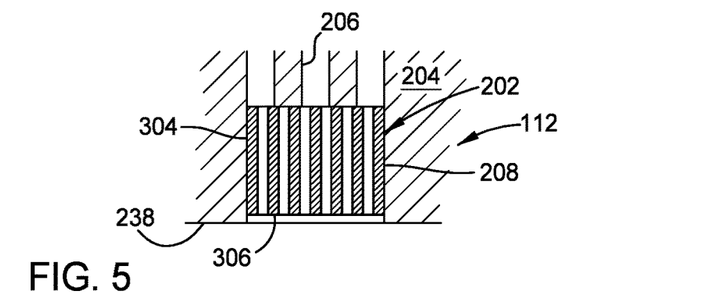
FIG. 5 is a cross-sectional view of a portion of the electrostatic chuck sintered with a porous plug according to one or more implementations of the present disclosure.

FIG. 5 is cross-sectional view of a portion of the ceramic body 204 with co-sintered the ceramic porous plug 202 according to another implementation of the present disclosure. In the example depicted in FIG. 5, the bottom surface 306 of the ceramic porous plug 202 is recessed from the bottom surface 238 of the ceramic body 204. The bottom surface 306 of the ceramic porous plug 202 may be recessed from the bottom surface 238 of the ceramic body 204 by any suitable technique. In one example, the bottom surface 306 of the ceramic porous plug 202 is machined below the bottom surface 238 of the ceramic body 204. In another example, a height of the ceramic porous plug 202 is smaller than a depth of the hole 208 formed in the ceramic body 204.

Figure 6:
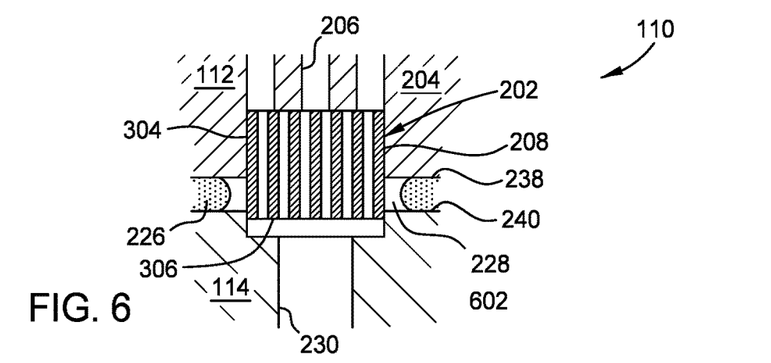
FIG. 6 is a cross-sectional view of a portion of a substrate support assembly illustrating an electrostatic chuck sintered with a porous plug, the porous plug mating with a temperature control base of the substrate support assembly according to one or more implementations of the present disclosure.

FIG. 6 is a cross-sectional view of a portion of a substrate support assembly 110 illustrating an electrostatic chuck 112 sintered with a ceramic porous plug 202, according to another implementation of the present disclosure. In FIG. 6, the ceramic porous plug 202 protrudes from the bottom surface 238 of the ceramic body 204. For example, the ceramic porous plug 202 may have a height that is greater than a depth of the hole 208 formed in the ceramic body 204.

In the example depicted in FIG. 6, the bottom surface 306 of the ceramic porous plug 202 protrudes from the bottom surface 238 of the ceramic body 204 a sufficient distance to shield the adhesive layer 226. In this manner, the adhesive layer 226 is shielded (i.e., substantially prevented) from being exposed to process or other gases that may be traveling though the porous plug 202. In one example, the bottom surface 306 of the ceramic porous plug 202 protrudes a distance the bottom surface 238 of the ceramic body 204 such that the bottom surface 306 is essentially coplanar with or extends below the top surface 240 of the temperature control base 114.

In the example depicted in FIG. 6, the bottom surface 306 of the ceramic porous plug 202 extends into a recess 602 in the top surface 240 of the temperature control base 114. The gas delivery hole 230 terminates at the recess 602 such that backside gas can readily flow through the gas delivery hole 230, through the plug 202 and into the backside gas passages 206. As the ceramic porous plug 202 extends through the gap 228 formed in the adhesive layer 226 and into the recess 602, the ceramic porous plug 202 effectively shields the adhesive layer 226 from gases flowing between the gas delivery hole 230 and the backside gas passages 206.

Figure 7:
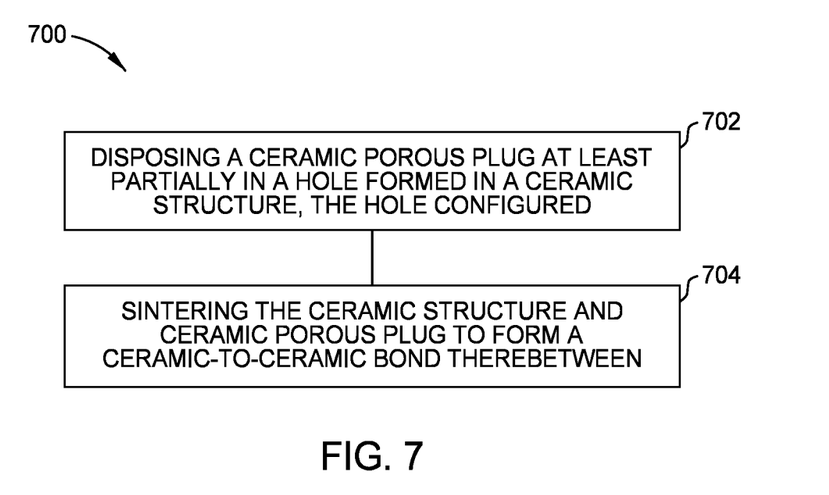
FIG. 7 is a flowchart of a method of forming an electrostatic chuck having a co-sintered porous plug according to one or more implementations of the present disclosure.

FIG. 7 is a flowchart of a method 700 of forming a ceramic structure sintered with porous plug 202 according to one or more implementations of the present disclosure. Although the method 700 describes sintering a ceramic porous plug 202 together with a ceramic structure to form a single fired ceramic body, the method 700 is particularly advantageous to form an electrostatic chuck 112. The method 700 can be practiced to join a ceramic porous plug 202 and a ceramic structure other than an electrostatic chuck to form a single fired ceramic body with an integral porous plug with a passage within the ceramic structure. Some non-limiting examples of ceramic structure include a plate, a shield, a liner, a body, a filter, a container and gas distribution plate, among others.

The method 700 begins at operation 702 by disposing a ceramic porous plug 202 at least partially in a hole 208 formed in a ceramic structure. In one example, the hole 208 is configured to become a fluid passage of the fired ceramic structure.

In an particular implementation of the method 700 utilized to form an electrostatic chuck 112, operation 702 includes disposing a ceramic porous plug 202 at least partially in a hole 208 formed in a green sheet of ceramic material. In one example, the hole 208 is configured to become a backside gas passage of an electrostatic chuck 112. In another example, the hole 208 is configured to become a passage of within another type of ceramic substrate.

The ceramic porous plug 202 is fully sintered prior to being disposed in the hole 208 of the ceramic body 204 at operation 702. Alternatively, the ceramic porous plug 202 may be partially sintered or fully unsintered prior to being disposed in the hole 208 at operation 702.

Likewise, the ceramic body 204 may be partially sintered or fully unsintered prior to receiving in the ceramic porous plug 202 into the hole 208 at operation 702. Alternatively, the ceramic porous plug 202 may be fully sintered prior to receiving in the ceramic porous plug 202 into the hole 208 at operation 702. In some examples, an unsintered ceramic porous plug 202 is disposed in the hole 208 of an unsintered, partially sintered, or fully sintered ceramic body 204 at operation 702. In some examples, a partially sintered ceramic porous plug 202 is disposed in the hole 208 of an unsintered, partially sintered, or fully sintered ceramic body 204 at operation 702. In still other examples, a fully sintered ceramic porous plug 202 is disposed in the hole 208 of an unsintered or partially sintered ceramic body 204 at operation 702.

At operation 702, the ceramic porous plug 202 may be disposed completely in the hole 208 such that the bottom surface 306 of the ceramic porous plug 202 is flush with or is recessed from the bottom surface 238 of the ceramic body 204. Alternatively, the ceramic porous plug 202 may be disposed in the hole 208 such that the bottom surface 306 of the ceramic porous plug 202 is protrudes beyond from the bottom surface 238 of the ceramic body 204. In some examples, the bottom surface 306 of the ceramic porous plug 202 may protrude enough that the ceramic porous plug 202 mates with a recess 602 formed in the bottom surface 238 of the ceramic body 204.

One or both of the ceramic porous plug 202 and the ceramic body 204 may comprise different types of ceramic material. For example, either one or both of the ceramic porous plug 202 and the ceramic body 204 may be fabricated with different size powder and or different types of ceramic material as discussed above.

At operation 704 of the method 700, the ceramic material of the porous plug 202 and the ceramic structure are sintered together to form a ceramic-to-ceramic bond therebetween. At operation 704, ceramic material of the porous plug 202 and the ceramic structure are sintered together to form a solid contiguous body of fired ceramic.

utilized to form an electrostatic chuck 112, operation 704 includes sintering the ceramic material of the porous plug 202 and the ceramic body 204 together to form a ceramic-to-ceramic bond therebetween. At operation 704, ceramic material of the porous plug 202 and the ceramic body 204 are sintered together to form a solid contiguous body of ceramic.

Thus, an electrostatic chuck and method for forming the same have been described above which leverage a ceramic-to-ceramic bond to eliminate the need for adhesives to secure a porous plug in a ceramic body of the electrostatic chuck. As the porous plug and body of the electrostatic chuck become a singular ceramic body, chuck failure modes are reduced while chuck service life is extended. Moreover, as there is no adhesives securing the plug to the chuck body, the amount of contamination as compared to conventional designs is significantly reduced, which advantageously improves production yields. As such, ceramic-to-ceramic bonding of the ceramic porous plug to the ceramic body results in a robust and reliable electrostatic chuck with vastly improved chuck-to-chuck performance uniformity. These benefits provide a significant reduction in the cost of ownership, while synergistically improving production yields and production capacity due to reduced particle contamination and longer mean times between service intervals associated with the use of the electrostatic chuck.

While the foregoing is directed to embodiments of the disclosure, other and further embodiments may be devised without departing from the basic scope thereof, and the scope thereof is determined by the claims that follow. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby.

We claim:

1. A method for fabricating an electrostatic chuck, the method comprising:
    disposing a ceramic porous plug at least partially in a hole formed in a ceramic body of the electrostatic chuck, the hole configured to become a fluid passage, the ceramic porous plug disposed in a portion of the hole located between an electrode and a bottom surface of the ceramic body; and
    forming a ceramic-to-ceramic bond between the ceramic body and the ceramic porous plug.

2. The method of claim 1, wherein ceramic plug is fully sintered prior to disposing the ceramic porous plug at least partially in the hole formed in the ceramic body.

3. The method of claim 2, wherein forming the ceramic-to-ceramic bond between the ceramic material and the ceramic porous plug comprises sintering.

4. The method of claim 2 further comprising:
    adhering a temperature control base to a bottom surface of a hole formed in a ceramic body, the hole configured to become a fluid passage.

5. The method of claim 4, wherein a bottom surface of the ceramic plug is recessed from a bottom surface of the ceramic body.

6. The method of claim 4, wherein a bottom surface of the ceramic plug projects beyond the bottom surface of the ceramic body and extends into the temperature control base.

7. The method of claim 1, wherein ceramic plug is partially sintered prior to disposing the ceramic porous plug at least partially in the hole formed in the ceramic body.

8. The method of claim 7, wherein forming the ceramic-to-ceramic bond between the ceramic body and the ceramic porous plug comprises sintering.

9. The method of claim 7 further comprising:
    adhering a temperature control base to a bottom surface of a hole formed in a ceramic body, the hole configured to become a fluid passage.

10. The method of claim 9, wherein a bottom surface of the ceramic plug is recessed from a bottom surface of the ceramic body.

11. The method of claim 9, wherein a bottom surface of the ceramic plug projects beyond the bottom surface of the ceramic body and extends into the temperature control base.

12. The method of claim 1, wherein ceramic plug is in a green state prior to disposing the ceramic porous plug at least partially in the hole formed in the ceramic body.

13. The method of claim 12 further comprising:
    adhering a temperature control base to a bottom surface of a hole formed in a ceramic body, the hole configured to become a fluid passage.

14. The method of claim 13, wherein a bottom surface of the ceramic plug is recessed from a bottom surface of the ceramic body.

15. The method of claim 13, wherein a bottom surface of the ceramic plug projects beyond the bottom surface of the ceramic body and extends into the temperature control base.

16. The method of claim 12, wherein forming the ceramic-to-ceramic bond between the ceramic material and the ceramic porous plug comprises sintering.

17. The method of claim 1, wherein ceramic plug has a cylindrical shape, a T-shape, a taper shape, or a rectangular shape.

18. The method of claim 1, wherein disposing the ceramic porous plug at least partially in the hole formed in the ceramic body further comprises:
    inserting the ceramic porous plug completely beyond the bottom surface of the sheet of ceramic sheet.

19. The method of claim 1, wherein disposing the ceramic porous plug at least partially in the hole formed in the ceramic body further comprises:
    leaving a portion of the ceramic porous plug projecting from the ceramic body.

20. The method of claim 1, wherein disposing the ceramic porous plug at least partially in the hole formed in the ceramic body further comprises:
    aligning a bottom of the ceramic porous plug flush with a bottom the ceramic body.

21. The method of claim 1 further comprising:
    making a bottom of the ceramic porous plug flush with a bottom the ceramic body after the ceramic-to-ceramic bond between the ceramic body and the ceramic porous plug is formed.

22. The method of claim 1 further comprising:
    making a bottom of the ceramic porous plug recessed from a bottom the ceramic body after the ceramic-to-ceramic bond between the ceramic body and the ceramic porous plug is formed.

23. A method of fabricating an electrostatic chuck comprising:
- applying adhesive to at least one of a ceramic body and a temperature control base, the ceramic body having a substrate support surface and a bottom surface, an electrode and a gas passage extending between the substrate support surface and the bottom surface, the ceramic body having a ceramic porous plug disposed in a portion of the gas passage located between the electrode and the bottom surface, the ceramic porous plug secured to the ceramic body with a ceramic-to-ceramic bond;
- aligning a gas delivery hole formed in the temperature control base with the gas passage formed in the ceramic body; and
- securing the bottom surface of the ceramic body to a top surface the temperature control base using the adhesive.

\* \* \* \* \*